United States Patent
Pyun

(10) Patent No.: US 10,064,267 B2
(45) Date of Patent: Aug. 28, 2018

(54) PRINTED CIRCUIT BOARD AND DISPLAY DEVICE INCLUDING THE SAME

(71) Applicant: LG Display Co., Ltd., Seoul (KR)

(72) Inventor: UnSeung Pyun, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 85 days.

(21) Appl. No.: 15/169,311

(22) Filed: May 31, 2016

(65) Prior Publication Data

US 2017/0118834 A1   Apr. 27, 2017

(30) Foreign Application Priority Data

Oct. 23, 2015   (KR) .................. 10-2015-0148288

(51) Int. Cl.
| | |
|---|---|
| *H05K 1/00* | (2006.01) |
| *H05K 1/18* | (2006.01) |
| *H05K 7/00* | (2006.01) |
| *H05K 1/02* | (2006.01) |
| *H05K 1/09* | (2006.01) |
| *H05K 1/11* | (2006.01) |
| *H05K 1/14* | (2006.01) |
| *G02F 1/13* | (2006.01) |

(52) U.S. Cl.
CPC ............. *H05K 1/0259* (2013.01); *G02F 1/13* (2013.01); *H05K 1/0215* (2013.01); *H05K 1/0216* (2013.01); *H05K 1/092* (2013.01); *H05K 1/111* (2013.01); *H05K 1/115* (2013.01); *H05K 1/144* (2013.01); *H05K 1/147* (2013.01); *H05K 2201/0919* (2013.01); *H05K 2201/09354* (2013.01); *H05K 2201/09618* (2013.01); *H05K 2201/10128* (2013.01); *H05K 2201/10409* (2013.01)

(58) Field of Classification Search
USPC .................................. 361/748, 679.01, 720
See application file for complete search history.

(56) References Cited

U.S. PATENT DOCUMENTS

| | | | |
|---|---|---|---|
| 6,504,590 B1 * | 1/2003 | Kikuchi | ............ G02F 1/133553 349/113 |
| 2008/0123016 A1 * | 5/2008 | Kwak | ............... G02F 1/133308 349/59 |
| 2015/0173176 A1 | 6/2015 | Lee | |

OTHER PUBLICATIONS

European Search Report for European Patent Application No. EP 16171916.6, Mar. 6, 2017, 6 Pages.

* cited by examiner

*Primary Examiner* — Andargie M Aychillhum
(74) *Attorney, Agent, or Firm* — Fenwick & West LLP

(57) ABSTRACT

A PCB underneath the display panel includes a plurality of insulation layers and one or more metal layers disposed between two adjacent insulation layers out of the plurality of insulation layers. A lower structure is disposed between the display panel and the PCB. At least a portion of a metal layer among the one or more metal layers that is most adjacent to the lower structure is exposed, and the lower structure is electrically connected to the exposed portion of the metal layer. Such exposed portion of the metal layer is electrically connected to the lower structure, so that the area where the PCB is referenced to the ground potential is increased. As a result, residual voltage, residual current in the PCB and noise caused by electromagnetic fields generated thereby can be reduced.

13 Claims, 4 Drawing Sheets

PRINTED CIRCUIT BOARD AND DISPLAY DEVICE INCLUDING THE SAME

CROSS-REFERENCE TO RELATED APPLICATIONS

This application claims the priority of Republic of Korea Patent Application No. 10-2015-0148288 filed on Oct. 23, 2015, in the Korean Intellectual Property Office, the disclosure of which is incorporated herein by reference.

BACKGROUND

Technical Field

The present disclosure relates to a printed circuit board and a display device including the same. More specifically, the present disclosure relates to a printed circuit board (PCB) capable of addressing electromagnetic interference (EMI) and electrostatic discharge (ESD) issues, and a display device including the same.

Description of the Related Art

Generally, a printed circuit board (PCB) supports electronic circuitry thereon that is formed by applying at least one metal layer on a thin insulation substrate and then removing parts of the metal layer. PCBs find applications in various fields. Among others, in a display device including a display panel, a PCB may be connected to the display panel to supply a signal for driving the display panel or a signal for controlling the operation of the display panel.

Recently, a PCB in a display device may include circuits having various functionalities and thus has complicated structure. Specifically, a PCB may include a driving unit such as a driving integrated circuit (IC) for supplying a signal for driving a display panel and a timing controller for controlling the timing operation of the display panel. In addition, a PCB may include a communications unit composed of various circuits for communicating with an external device depending on the application of the display device. As such, PCBs include more complicated and various circuits, the PCBs include more lines for connecting such circuits. To implement complicated circuits with many lines, PCBs have a stack structure consisting of a plurality of metal layers and insulation layers in order to include more metal layers.

As PCBs have the stack structure and accordingly include many metal layers therein, voltage and electric current flowing in the PCBs have increased. Some of the voltage and electric current in the PCBs act as noise or interference to the integrated circuits in the PCBs. That is, the residual voltage and residual current in the PCBs generate electromagnetic fields which act as noise or interference. Such electromagnetic fields may have various frequencies. Such various frequencies of the noise caused by electromagnetic fields in the PCBs may superpose or overlap with the frequencies of signals supplied to the display panel from the driving unit or the frequencies of signals transmitted/received to/from the communications unit. As a result, there is a problem in that interference takes place in the signal from the driving unit or the signal to/from the communications unit by the noise caused by electromagnetic fields in the PCBs.

To address the above-mentioned problem, what is required is a PCB capable of effectively removing residual voltage and residual current in the PCB, and a display device including the same.

SUMMARY

To address the problem of interference affecting the signals supplied to a display panel due to the noise caused by electromagnetic fields in a PCB, embodiments of this disclosure provide a novel structure of a PCB that can remove or effectively suppress the electromagnetic fields generated by the residual voltage and residual current in the PCB, and a display device including the same.

An object of the present disclosure is to provide a PCB that can greatly reduce residual voltage and residual current in the PCB by way of exposing a metal layer at the periphery of the rear surface of the PCB to thereby increase the area where a lower structure is electrically connected to the metal 1 of the PCB, and a display device including the same.

Another object of the present disclosure is to provide a PCB that can improve EMI and ESD byway of discharging the residual voltage and residual current to ground to thereby reduce noise caused by electromagnetic fields from interfering with signals supplied to the display panel or signals to/from an external device, and a display device including the same.

It should be noted that objects of the present disclosure are not limited to the above-described objects, and other objects of the present disclosure will be apparent to those skilled in the art from the following descriptions.

According to an exemplary embodiment of the present disclosure, there is provided a display device. The display device includes a display panel. A PCB is disposed below the display panel and includes a plurality of insulation layers and one or more metal layers disposed between two adjacent insulation layers out of the plurality of insulation layers. A lower structure is disposed between the display panel and the PCB. At least a portion of a metal layer among the one or more metal layers that is most adjacent to the lower structure is exposed, and the lower structure is electrically connected to the exposed portion of the metal layer. In the display device, the exposed portion of the metal layer is electrically connected to the lower structure, so that the area where the PCB is referenced to the ground potential is increased. As a result, residual voltage, residual current in the PCB and noise caused by electromagnetic fields generated thereby can be reduced.

According to another exemplary embodiment of the present disclosure, there is provided a display device including a display panel. A printed circuit board (PCB) is configured to transmit a signal to the display panel. A lower structure is configured to support the display panel and the PCB. The PCB may include a metal layer configured to discharge electromagnetic field at a periphery of the PCB to the lower structure. In the display device according to this aspect of the present disclosure, noise caused by electromagnetic fields at the periphery of the PCB can be efficiency discharged to the lower structure.

According to yet another exemplary embodiment of the present disclosure, there is provided a PCB including a plurality of insulation layers. At least one metal layers are respectively disposed between two adjacent insulation layers out of the plurality of insulation layers. At least a portion of the bottom surface of a metal ground layer disposed in the lowest one of the at least one metal layers is exposed. Accordingly, the interference between signals supplied from the PCB and noise caused by electromagnetic fields in the PCB is reduced, such that EMI and ESD can be improved.

Particulars of the exemplary embodiments of the present disclosure will be described in the detail description with reference to the accompanying drawings.

According to an exemplary embodiment of the present disclosure, a PCB capable of greatly reducing residual voltage and residual current generating noise caused by electromagnetic fields in the PCB, and a display device including the same can be manufactured.

According to another exemplary embodiment of the present disclosure, a PCB capable of improving EMI and ESD by way of reducing noise caused by electromagnetic fields interfering a signal supplied to a display panel or a signal to/from an external device, and a display device including the same can be manufactured.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
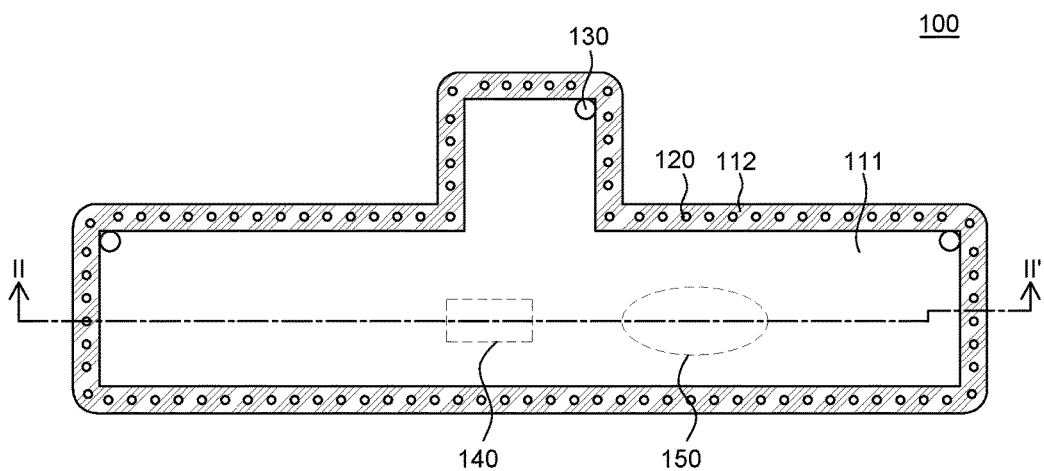
FIG. 1 is a rear view of a printed circuit board according to an exemplary embodiment of the present disclosure.

Advantages and features of the present disclosure and methods to achieve them will become apparent from the descriptions of exemplary embodiments hereinbelow with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Further, in describing the present disclosure, descriptions on well-known technologies may be omitted in order not to obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," and "the," this includes a plural of that noun unless specifically stated otherwise.

For elements having specific values, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms "first," "second" and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

Figure 2:
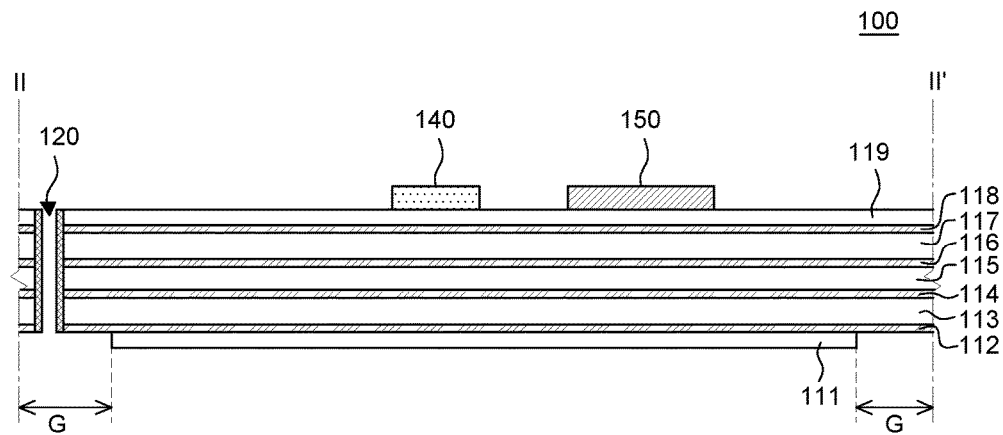
FIG. 2 is a cross-sectional view of a printed circuit board according to an exemplary embodiment of the present disclosure, taken along line II-II' of FIG. 1.

FIG. 1 is a rear view of a printed circuit board (PCB) according to an exemplary embodiment of the present disclosure. FIG. 2 is a cross-sectional view of a printed circuit board (PCB) according to an exemplary embodiment of the present disclosure, taken along line II-II' of FIG. 1. Referring to FIGS. 1 and 2, a printed circuit board (PCB) includes a plurality of insulation layers 111, 113, 115, 117 and 119, a plurality of metal layers 112, 114, 116 and 118, vias 120, ground holes 130, a driving unit 140 and a communications unit 150.

The PCB (or some other equivalent element, such as a substrate, a flexible film, a thin support layer, etc. having similar functions) includes the plurality of insulation layers 111, 113, 115, 117 and 119 and the plurality of metal layers 112, 114, 116 and 118 each disposed between the respective two adjacent insulation layers 111, 113, 115, 117 and 119. That is, the PCB 100 is formed by (or has thereon) alternately stacking the metal layers 112, 114, 116 and 118 and the insulation layers 111, 113, 115, 117 and 119. For example, in the PCB 100 shown in FIG. 2, a first insulation layer 111 is disposed at the bottom, a first metal layer 112 is disposed on the first insulation layer 111, a second insulation layer 113 is disposed on the first metal layer 112, a second metal layer 114 is disposed on the second insulation layer 113, a third insulation layer 115 is disposed on the second metal layer 114, a third metal layer 116 is disposed on the third insulation layer 115, a fourth insulation layer 117 is disposed on the third metal layer 116, a fourth metal layer 118 is disposed on the fourth insulation layer 117, and a fifth insulation layer 119 is disposed on the fourth metal layer 118. That is, each of the metal layers of in the PCB 100 may be disposed between the respective two adjacent insulation layers 111, 113, 115, 117 and 119. The stack structure of the PCB 100 shown in FIG. 2 is an example and the numbers of the metal layers and the insulation layers may vary in other exemplary embodiments of the present disclosure. However, at least two insulation layers and at least one metal layer are required in the PCB 100.

Referring to FIGS. 1 and 2, the insulation layers may be the outermost surfaces of the PCB 100. Specifically, the first insulation layer 111 is the bottom surface of the PCB 100 and the fifth insulation layer 119 is a part of the top surface of the PCB 100. Accordingly, the first insulation layer 111 and the fifth insulation layer 119 of the PCB 100 may insulate the plurality of metal layers 112, 114, 116 and 118 from conductive material outside the PCB 100.

In addition, in the PCB 100, the insulation layers 111 and 119 and the insulation layers 113, 115 and 117 may insulate the respective metal layers 112, 114, 116 and 118 therebetween from one another.

To this end, the plurality of insulation layers 111, 113, 115, 117 and 119 is made of an insulation material to insulate the metal layers from one another. In some embodiments of the present disclosure, however, the plurality of insulation layers 111, 113, 115, 117 and 119 may be made of different materials. Specifically, the first insulation layer 111 and the fifth insulation layer 119 which are outermost surfaces of the PCB 100 may be made of a solder resist or some other equivalent material. The second insulation layer 113, the third insulation layer 115 and the fourth insulation layer 117 may be glass fiber layers of some other equivalent layers.

Referring to FIG. 2, in the PCB 100, each of the plurality of metal layers 112, 114, 116 and 118 is disposed between the respective two adjacent insulation layers 111, 113, 115, 117 and 119. Accordingly, the plurality of metal layers 112, 114, 116 and 118 is insulated from one another by the insulation layers, and thus different signals and/or power can be transmitted (or applied) along the metal layers 112, 114, 116 and 118. For example, in the PCB 100, the first metal layer 112 disposed at the outermost side and the fourth metal layer 118 may work as metal ground layers, and the second metal layer 114 and the third metal layer 116 may supply signals and power to the driving unit 140, the communications unit 150 or an external circuit connected to the PCB 100.

The first metal layer 112, the second metal layer 114, the third metal layer 116 and the fourth metal layer 118 may be made of a conductive material and all of them may be made of the same material. For example, the first metal layer 112, the second metal layer 114, the third metal layer 116 and the fourth metal layer 118 may be made of copper.

Referring to FIGS. 1 and 2, the driving unit 140 and the communications unit 150 are disposed on the top surface of the PCB 100. Specifically, the driving unit 140 and the communications unit 150 are disposed on the fifth insulation layer 119 of the PCB 100. Although only one driving unit 140 and only one communications unit 150 are specifically shown in FIGS. 1 and 2, the PCB 100 may include more than one driving units and communications units in some exemplary embodiments. Alternatively, the communications unit 150 may be eliminated depending on the type of the device employing the PCB 100.

The driving unit 140 supplies a variety of signals and power to devices or components electrically connected to the PCB 100. Specifically, the driving unit 140 supplies a control signal for controlling a device or a component, or supplies a drive signal for driving a device or a component. For example, the driving unit 140 includes a driving integrated circuit (IC) and a timing controller. That is, the driving unit 140 supplies power and electric current to a device or a component electrically connected thereto, and the power and the electric current supplied from the driving unit 140 have a predetermined frequency.

In some embodiments of the present disclosure, the communications unit 150 may transmit/receive signals to/from an external device to communicate with it. For example, when the PCB 100 is included in communication equipment such as a smartphone, the communications unit 150 may transmit/receive various signals to communicate with an external device.

Even if the driving unit 140 and the communications unit 150 are disposed on the fifth insulation layer 119, they may be interfered by residual voltage and residual current on the metal layers in the PCB 100 and electromagnetic fields generated thereby. The residual voltage and the residual current refer to unnecessary voltage and current in the PCB 100 remaining as noise, distinct from the signals and power supplied from the driving unit 140 and the communications unit 150. The residual voltage and the residual current may generate electromagnetic fields, which act as noise to the signals and power supplied from the driving unit 140 and the communications unit 150. That is, the residual voltage and the residual current remaining on the metal layers in the PCB 100 and the electromagnetic fields generated thereby may generate undesired noise signals. Accordingly, the signal supplied from the driving unit 140 to a device such as display panel or the signal for communicating with an external device supplied from the communications unit 150 may superpose the residual voltage and the residual current remaining on the metal layers in the PCB 100 and the electromagnetic fields generated thereby. The residual voltage and the residual current remaining on the metal layers in the PCB 100 and the electromagnetic fields generated thereby may be delivered to the driving unit 140 and the communications unit 150 connected to the PCB 100, such that the driving unit 140 and the communications unit 150 may operate erroneously or the signals from the driving unit and the communications unit 150 may be interfered, resulting in problems.

Referring to FIGS. 1 and 2, the vias 120 (or contact regions) have a hole-like shape and penetrate the PCB 100. In addition, the vias 120 are disposed along the periphery of the PCB 100. Specifically, the vias 120 are formed along the periphery of the PCB 100 at a regular spacing as penetrating the PCB 100, thus forming so-called stitching vias due to their shape or configuration. In addition, a vias 120 are made up of a metal layer formed along the side surface of a through-hole in the PCB 100. That is, a vias 120 can be surrounded with a metal layer forming a cylindrical hole in the PCB 100. By doing so, as shown in FIG. 2, each of the vias 120 may come in contact with all of the metal layers 112, 114, 116 and 118 in the PCB 100. In some embodiments of the present disclosure, each of the vias 120 may contact with at least one of the metal layers 112, 114, 116 and 118 in the PCB 100.

The vias 120 may be made of conductive material. In addition, the vias 120 may be made of the same material as that of the plurality of metal layers 112, 114, 116 and 118. For example, the vias 120 may be made of copper, like the plurality of metal layers 112, 114, 116 and 118.

Accordingly, the vias 120 may contact with the metal layers 112, 114, 116 and 118 in the PCB 100 to form a common ground. That is, the vias 120 may work as a common ground for circuits in the PCB 100.

Referring to FIG. 1, the ground holes 130 are formed in the first insulation layer 111. The ground holes 130 have a hole-like shape having a diameter larger than the diameter of the vias 120, such that the PCB 100 may be connected to ground potential. For example, the ground holes 130 may penetrate the PCB 100.

The PCB 100 may be referenced to ground potential (i.e. external ground) via the ground holes 130. Specifically, a fixing screw made of a conductive material is disposed in each of the ground holes 130, and the ground holes 130 may be electrically connected to the external ground via the fixing screw.

Accordingly, the vias 120 connect the metal layers in the PCB 100 to the common ground, and the ground holes 130 electrically connect the PCB 100 to the external ground, such that the PCB 100 can be referenced to the external ground.

Referring to FIGS. 1 and 2, the first insulation layer 111 is disposed only on a part of the rear surface of the PCB 100. Accordingly, a part of the bottom surface of the first metal layer 112, i.e., an exposed portion G of the first metal layer 112 is not covered by the first insulation layer 111.

Accordingly, the first metal layer 112 is electrically connected to the external ground such that the PCB 100 can be referenced to the ground potential. Specifically, the exposed portion G of the first metal layer 112 may contact with or be electrically connected to the external ground, such that the PCB 100 can be referenced to the ground potential. That is, the first metal layer 112 may be a metal ground layer that is electrically connected to the external ground such that the PCB 100 is referenced to the ground potential.

The residual voltage and the residual current remaining in the PCB 100 and the electromagnetic fields generated thereby may be concentrated more at the periphery than at the center of the PCB 100. In order to efficiency remove such noise, it is necessary to provide a larger and more efficient ground connection at the periphery of the PCB 100.

That is, the location and the area of the exposed portion G of the first metal layer 112 may vary depending on implementations, in order to efficiency discharge the residual voltage and the residual current in the PCB 100. For example, the first insulation layer 111 may be disposed on the rear surface of the PCB 100 except for the periphery, such that the first metal layer 112 may be exposed at the periphery of the rear surface of the PCB 100. Accordingly, the first metal layer 112 is electrically connected to the external ground at the periphery of the PCB 100, such that the PCB 100 is referenced to the ground potential. As a result, the residual voltage and the residual current concentrated at the periphery of the PCB 100 can be discharged more quickly.

In addition, the location of the exposed portion G of the first metal layer 112 may overlap the location of the vias 120 and may be larger than the vias 120. In other words, in FIG. 2, the width of the cross section of the vias 120 may be smaller than the width of the exposed portion G of the first metal layer 112. In addition, the area of the exposed portion G of the first metal layer 112 may be larger than the cross sectional area of the ground holes 130. Accordingly, the exposed portion G of the first metal layer 112 may have a ground area larger than the ground holes 130.

In the PCB 100 according to an exemplary embodiment of the present disclosure, the first metal layer 112 is exposed at the periphery of a surface thereof. The first metal layer 112, via the ground holes 130, may be electrically connected to the external ground. Accordingly, the residual voltage and the residual current remaining in the PCB 100 can be discharged to the external ground via the first metal layer 112. As a result, noise in the PCB 100 can be greatly reduced.

Specifically, the first metal layer 112 is exposed at the periphery of the bottom surface of the PCB 100, and the exposed portion G of the metal layer 112 may be electrically connected to the external ground at the periphery of the PCB 100. As a result, the residual voltage and the residual current concentrated at the periphery of the PCB 100 can be discharged quickly along a ground path formed at the periphery of the PCB 100.

Further, the exposed portion G of the first metal layer 112 is larger than the cross section of the ground holes 130, a sufficient area is provided for the first metal layer 112 to be electrically connected to the external ground. Since the exposed portion G of the first metal layer 112 provides a large ground area, the residual voltage and the residual current remaining in the PCB 100 can be discharged to the external ground more efficiently.

As a result, the interference between the signal from the driving unit 140 and the noise caused by electromagnetic fields generated by the residual voltage and the residual current in the PCB 100 or between the signal to/from the communications unit 150 and the noise caused by electromagnetic fields can be greatly reduced. As the noise caused by electromagnetic fields in the PCB 100 is reduced, suppression of the EMI and the ESD of the PCB 100 can be improved.

Figure 3:
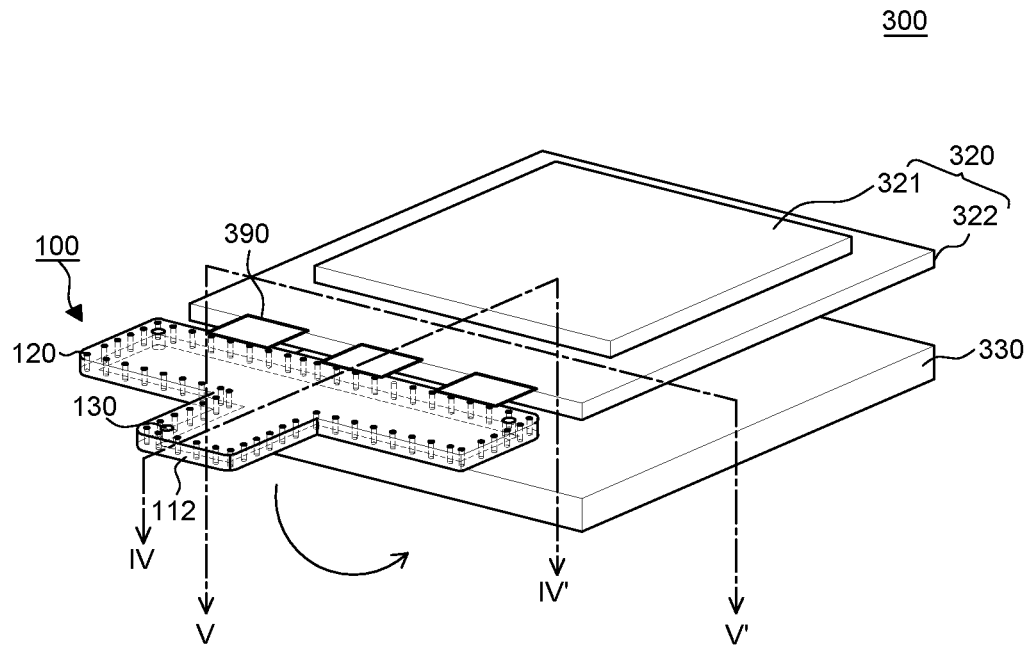
FIG. 3 is an exploded perspective view of a display device according to an exemplary embodiment of the present disclosure.

FIG. 3 is an exploded perspective view of a display device according to an exemplary embodiment of the present disclosure. A display device 300 shown in FIG. 3 includes a PCB 100, a display panel 320, a lower structure 330 and a connection film 390. The display device 300 shown in FIG. 3 is a combination of the PCB 100 shown in FIG. 1, the display panel 320 and the lower structure 330. The configuration of the PCB 100 of FIG. 3 is substantially the same as that of the PCB 100 of FIG. 1; and, therefore, will not be described to avoid redundancy. For convenience of illustration, FIG. 3 is an exploded perspective view of the display device before the PCB 100 is combined with the display panel 320 and the lower structure 330. The shape and additional configuration of the lower structure 330 will be described in detail with reference to FIGS. 4 to 7.

Referring to FIG. 3, the display panel 320 includes a display part 321 and a substrate 322. The substrate 322 may be made of an insulation material. For example, the substrate 322 may be made of glass or flexible plastic.

The display part 321 is disposed on the substrate 322. Specifically, the display part 321 may include a display element and a display driving unit. The display driving unit includes a variety of elements required for driving the display element such as thin-film transistors (TFTs), capacitors, various conductive lines, wires, circuits, etc. The display element may be a liquid-crystal display element or an organic light-emitting element depending on the type of the display device 300. For example, in the case that the display panel 320 is a liquid-crystal display panel, the display element on the substrate 322 includes pixel electrodes, a common electrode and liquid crystals. In addition, a color filter may be disposed on the display element. In the case that the display panel 320 is an organic light-emitting display panel, the display element on the substrate 322 includes an anode, a cathode and an emission layer, etc. In addition, a color filter may be disposed on the display element.

Referring to FIG. 3, the PCB 100 is disposed adjacent to one end of the substrate 322. Specifically, the PCB 100 is disposed adjacent to one end of the substrate 322 such that the surface shown as the rear surface in FIGS. 1 and 2 faces downwardly.

The lower structure 330 is disposed under the display panel 320. The lower structure 330 supports the display panel 320 and may include some elements necessary for the display panel 320. For example, in the case that the display panel 320 is a liquid-crystal display panel, the lower structure 330 may include a back light unit (BLU).

The lower structure 330 includes a conductive material. Accordingly, the lower structure 330 may be electrically connected to the PCB 100 such that the PCB 100 is referenced to the ground potential. The functionality of the lower structure 330 and the way how the lower structure 330 is coupled with the display panel 320 and the PCB 100 will be described in detail with reference to FIGS. 4 and 5.

The connection film 390 includes a film-like plastic substrate and at least one among circuits, an integrated chip, conductive lines, etc. thereon. The connection film 390 may thus electrically connect the PCB 100 to the substrate 322. That is, a variety of signals may be delivered between the PCB 100 and the substrate 322 via the connection film 390.

Referring to FIG. 3, the connection film 390 is disposed adjacent to one end of the PCB 100. Specifically, the connection film 390 is attached to the end of the PCB 100 facing the one end of the substrate 322. In addition, the connection film 390 is attached also to the one end of the substrate 322 to electrically connect the PCB 100 to the substrate 322.

Since the connection film 390 is made of flexible plastic, it can be bent, folded, flexed or otherwise manipulated in shape. That is, the connection film 390 may be bent in the direction indicated by the arrow shown in FIG. 3. Accordingly, the connection film 390 is bent between the side of the PCB 100 and the sides of the display panel 320 and the lower structure 330, such that the bottom surface of the PCB 100 faces the bottom surface of the lower structure 330. That is, as the connection film 390 is bent, the first insulation layer 111 and the exposed portion of the first metal layer 112 at the periphery of the bottom surface of the PCB 100 will become adjacent to the bottom surface of the lower structure 330. The way the lower structure 330 is coupled with the PCB 100 by the bent connection film 390 will be described with reference to FIGS. 4 and 7.

Figure 4:
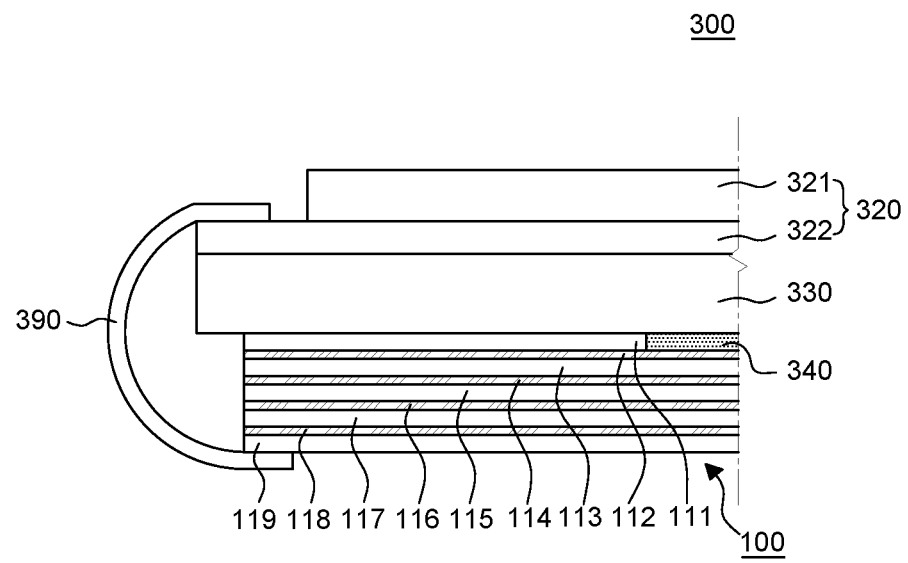
FIG. 4 is a cross-sectional view of the display device according to the exemplary embodiment of the present disclosure, taken along line IV-IV' of FIG. 3.
Figure 5:
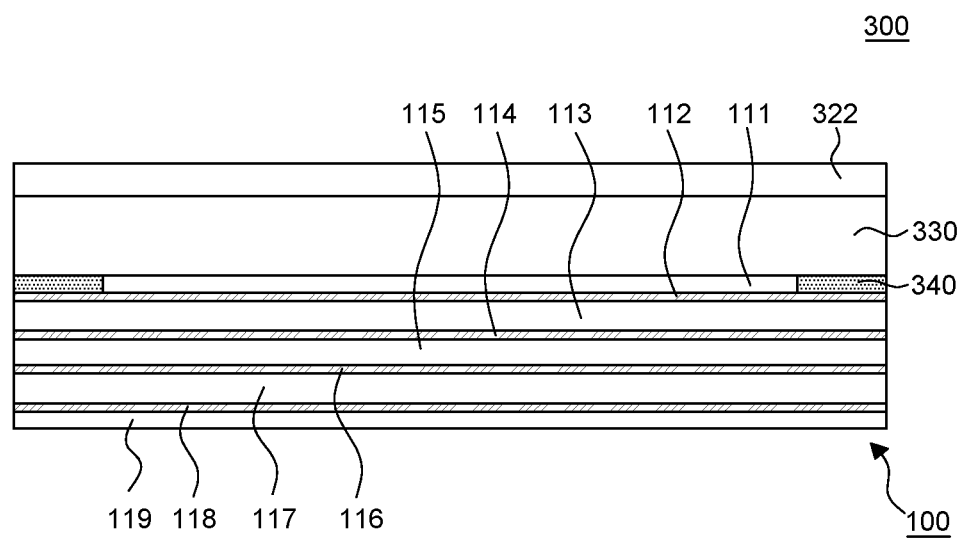
FIG. 5 is a cross-sectional view of the display device according to the exemplary embodiment of the present disclosure, taken along line V-V' of FIG. 3.

FIG. 4 is a cross-sectional view of the display device according to the exemplary embodiment of the present disclosure, taken along line IV-IV' of FIG. 3. FIG. 5 is a cross-sectional view of the display device according to the exemplary embodiment of the present disclosure, taken along line V-V' of FIG. 3. Specifically, FIGS. 4 and 5 are cross-sectional views of the display device 300 that the connection film 390 is bent such that the PCB 100 and the display panel 320 are coupled with the lower structure 330.

Referring to FIGS. 4 and 5, a conductive adhesive pad 340 is disposed between the PCB 100 and the lower structure 330. Specifically, the conductive adhesive pad 340 is disposed at a position where the exposed portion of the first metal layer 112 on the top surface of the PCB 100 is adjacent to the lower structure 330. For example, the conductive adhesive pad 340 may cover the entire space between the exposed portion of the first metal layer 112 and the lower structure 330.

The conductive adhesive pad 340 is made of an adhesive material containing a conductive material. For example, the conductive adhesive pad 340 may be made of metal paste. Accordingly, the conductive adhesive pad 340 attaches the PCB 100 to the lower structure 330 and electrically connects the exposed portion of the first metal layer 112 to the lower structure 330.

As a result, a ground path from the exposed portion of the first metal layer 112 to the lower structure 330 through the conductive adhesive pad 340 is disposed, such that the PCB 100 may have a large area for ground connection.

Referring to FIGS. 4 and 5, the lower structure 330 is disposed between the display panel 320 and the PCB 100. Specifically, the lower structure 330 is disposed between the top surface of the PCB 100 and the bottom surface of the substrate 322. The lower structure 330 is disposed such that the display panel 320 and the PCB 330 are fixed thereto. In addition, one side of the lower structure 330 is enclosed by the connection film 390. An empty space may be formed between the bent portion of the connection film 390 and the lower structure 330.

Further, the driving unit 140 and the communications unit 150 in the PCB 100 may be located between the bottom surface of the display panel 320 and the top surface of the PCB 100 after the connection film 390 has been bent.

As the PCB 100 includes more metal layers and becomes larger due to the need to support more functionality, the residual voltage and the residual current remaining in the PCB 100 and the electromagnetic fields generated thereby increase as well. Such residual voltage and residual current and such electromagnetic fields may be noise that adversely affects the driving unit 140 and the communications unit 150 in the PCB 100.

In the display device 300 according to the exemplary embodiment of the present disclosure, the connection film 390 is bent such that the PCB 100 contacts with the bottom surface of the lower structure 330. Specifically, in the PCB 100, the top surface of the first insulation layer 111 may contact with the bottom surface of the lower structure 330, and the exposed portion of the first metal layer 112 at the periphery of the top surface of the PCB 100 can be electrically connected to the lower structure 330 via the conductive adhesive pad 340.

Specifically, the lower structure 330 may be coupled with the PCB 100 by the fixing screw (or other attaching means such as couplers, adhesive, etc.) of each of the ground holes 130 and the conductive adhesive pad 340. The lower structure 330 may be coupled with the PCB 100 by the fixing screw disposed in each of the ground holes 130 such that the PCB 100 can be referenced to the ground potential. That is, the lower structure 330 allows the PCB 100 to be referenced to the external ground via the ground holes 130, such that the residual voltage, the residual current in the PCB 100 and the electromagnetic field generated thereby can be reduced.

Further, the lower structure 330 is fixed to the PCB 100 by the conductive adhesive pad 340 and is electrically connected to the first metal layer 112 of the PCB 100. Accordingly, the first metal layer 112 in the PCB 100 is electrically connected to the lower structure 330 via the conductive adhesive pad 340, such that the PCB 100 can be referenced to the ground potential with a larger area than the area provided by the ground holes 130. That is, the first metal layer 112 is electrically connected to the lower structure 330 by the conductive adhesive pad 340, such that the residual voltage and the residual current in the PCB 100 can be discharged to the lower structure 330 more efficiency. As a result, noise caused by electromagnetic fields in the PCB 100 can be greatly reduced.

Figure 6:
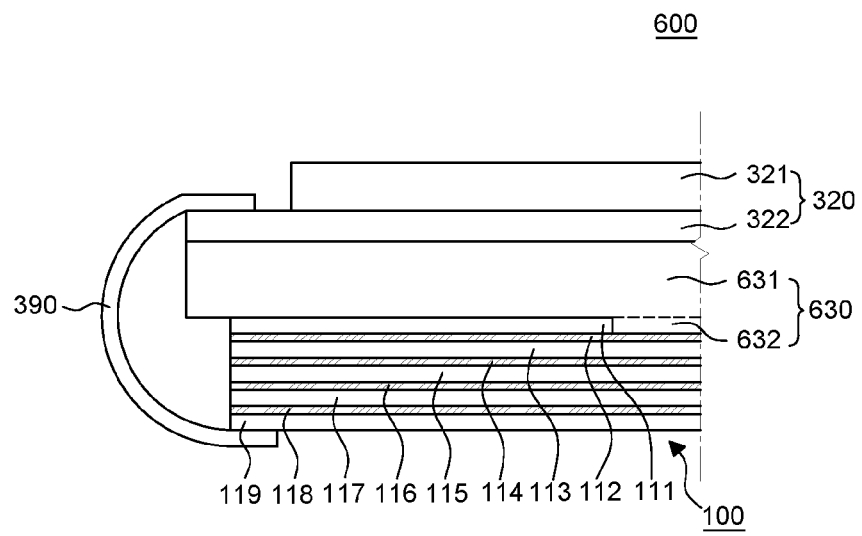
FIGS. 6 and 7 are cross-sectional views of a display device according to another exemplary embodiment of the present disclosure.
Figure 7:
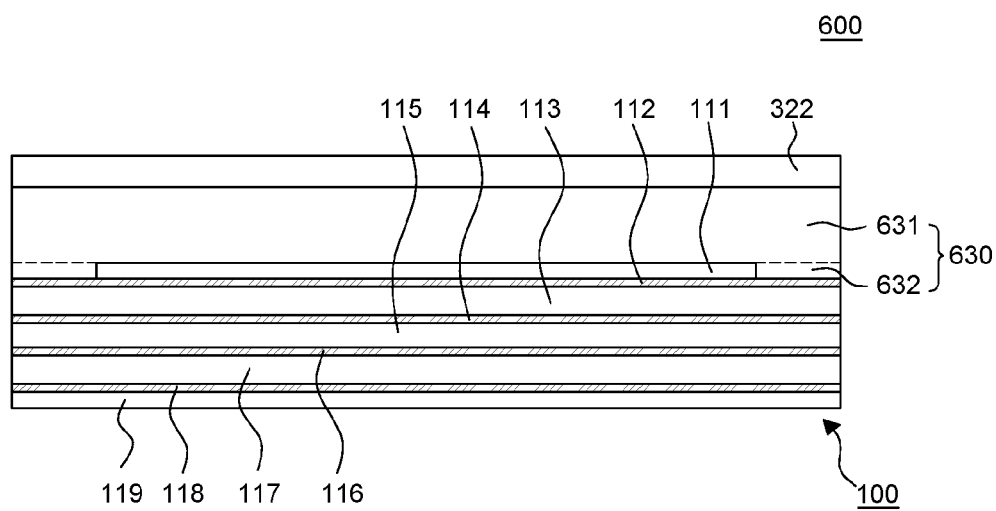

FIGS. 6 and 7 are cross-sectional views of a display device according to another exemplary embodiment of the present disclosure. FIG. 6 is a cross-sectional view of the display device according to another exemplary embodiment of the present disclosure, taken along line IV-IV' of FIG. 3. FIG. 7 is a cross-sectional view of the display device according to the exemplary embodiment of the present disclosure, taken along line IV-IV' of FIG. 3. The display device 600 shown in FIGS. 6 and 7 is substantially same as the display device 300 shown in FIGS. 3 to 5 except that the structure of a lower structure 630 is changed and the conductive adhesive pad 340 is eliminated; and, therefore, the redundant description will be omitted.

Referring to FIGS. 6 and 7, the lower structure 630 includes a base 631 and a protrusion 632. That is, the lower structure 630 includes the protrusion 632 that protrudes from the base 631 toward the exposed portion of the first metal layer 112. Accordingly, the lower structure 630 may contact with the exposed portion of the first metal layer 112 by the protrusion 632. That is, the lower structure 630 includes the protrusion 632 so that it conforms to the top surface of the PCB 100, and thus the PCB 100 can be fixed to the bottom surface of the lower structure 630 without any additional adhesive. The lower structure 630 including the protrusion 632 may be formed simply by an injection molding method.

The lower structure 630 includes a conductive material. Accordingly, the lower structure 630 may contact with the exposed portion of the first metal layer 112 by the protrusion 632, such that the PCB 100 can be referenced to the ground potential. In addition, the lower structure 630 is made of a conductive material, such that the PCB 100 is electrically connected to the lower structure 630 via the exposed portion of the first metal layer 112. Accordingly, no additional adhesive pad is required between the PCB 100 and the lower structure 630.

The protrusion 632 may have a variety of shapes. For example, the protrusion 632 may have the shape shown in FIG. 6 so that it contacts with the entirety of the exposed portion of the first metal layer 112, may have a tapered shape so that it contacts with only a part of the exposed portion of the first metal layer 112, or may have a pillar-like shape. That is, the protrusion 632 may have a variety of shapes as long as it may contact with the exposed portion of the first metal layer 112.

In the display device 600 according to this exemplary embodiment of the present disclosure, the PCB 100 contacts with the lower structure 630 via the exposed portion of the first metal layer 112 and is electrically connected thereto directly. Accordingly, the residual voltage and the residual current remaining in the PCB 100 can be discharged via the lower structure 630 in direct contact with the PCB 100. As a result, noise caused by electromagnetic fields in the PCB 100 can be greatly reduced.

Further, the lower structure 630 may be produced by an injection molding method, and thus the lower structure 630 having the protrusion 632 can be formed by a very simple process. Namely, the process of forming the lower structure 630 having the protrusion 632 is not more difficult or more expensive than the process of forming the lower structure 630 not having the protrusion 632. Accordingly, the lower structure 630 having the protrusion 632 can be produced without any additional cost or increase in processing time, and thus the display device 600 can also be easily produced.

Furthermore, the height of the protrusion 632 from the lower structure 630 may be equal to the height of the exposed portion of the first metal layer 112. Specifically, the protrusion 632 of the lower structure 630 may conform to the top surface of the PCB 100, or the portion of the lower structure 630 that corresponds to the other portion of the first metal layer 112 except the exposed portion may be recessed so that it may conform to the top surface of the PCB 100. That is, the portion of the lower structure 630 corresponding to the first insulation layer 111 of the PCB 100 may be recessed and the portion of the lower structure 630 corresponding to the exposed portion of the first metal layer 112 of the PCB 100 may protrude. Accordingly, the portion of the lower structure 630 corresponding to the first insulation layer 111 of the PCB 100 becomes thinner, and the display device 600 can become even thinner.

In addition, as the lower structure 630 conforms to the top surface of the PCB 100, the PCB 100 can be reliably fixed to the bottom surface of the lower structure 630. That is, as the lower structure 630 includes the protrusion 632 and the PCB 100 contacts with the lower structure 630 directly via the exposed portion of the first metal layer 112, the PCB 100 can be coupled with and electrically connected to the lower structure 630 even without any additional element such as a conductive adhesive for electrically connecting the PCB 100 to the lower structure 630. Since no conductive adhesive is required, manufacturing cost can be saved.

The exemplary embodiments of the present disclosure can also be described as follows:

According to an aspect of the present disclosure, there is provided a display device that includes a display panel. A PCB is disposed below the display panel and includes a plurality of insulation layers and one or more metal layers disposed between two adjacent insulation layers out of the plurality of insulation layers. A lower structure is disposed between the display panel and the PCB. At least a portion of a metal layer among the one or more metal layers that is most adjacent to the lower structure is exposed, and the lower structure is electrically connected to the exposed portion of the metal layer. In the display device, the exposed portion of the metal layer is electrically connected to the lower structure, so that the area where the PCB is referenced to the ground potential is increased. As a result, residual voltage, residual current in the PCB and noise caused by electromagnetic fields generated thereby can be reduced.

The exposed portion of the metal layer may be at a periphery of an outer surface of the PCB.

The PCB may include a plurality of vias, and the plurality of vias may be overlapped with the exposed portion of the metal layer.

The PCB may include a fixing screw to fix the PCB and the lower structure, and may further include a ground hole for electrically connecting to the lower structure.

The display device may further include a conductive adhesive pad between the exposed portion of the metal layer and the lower structure.

The conductive adhesive pad may be a metal paste.

The lower structure may include a protrusion that contacts with the exposed portion of the metal layer directly.

The PCB may include a driving unit or a communications unit, and the driving unit or the communications unit may be disposed between a bottom surface of the lower structure and a top surface of the PCB.

According to another aspect of the present disclosure, there is provided a display device including a display panel. A printed circuit board (PCB) is configured to transmit a signal to the display panel. A lower structure is configured to support the display panel and the PCB. The PCB may include a metal layer configured to discharge electromagnetic field at a periphery of the PCB to the lower structure. In the display device according to this aspect of the present disclosure, noise caused by electromagnetic fields at the periphery of the PCB can be efficiency discharged to the lower structure.

The display device may further include: a plurality of insulation layers each contacted with either surface of the metal layer, and an insulation layer among the plurality of insulation layers that is adjacent to the lower structure may allow at least a portion of the metal layer to be electrically connected to the lower structure.

The PCB may include a driving unit or a communications unit, and the metal layer may discharge residual voltage and residual current from the periphery to the lower structure to minimize noise that the residual voltage and the residual current affects to the driving unit or the communications unit.

According to yet another aspect of the present disclosure, there is provided a PCB including a plurality of insulation layers. At least one metal layer is disposed between two adjacent insulation layers out of the plurality of insulation layers. At least a portion of the bottom surface of a metal ground layer disposed in the lowest one of the at least one metal layers is exposed. Accordingly, the interference between signals supplied from the PCB and noise caused by electromagnetic fields in the PCB is reduced, such that EMI and ESD can be improved.

The PCB may further include: a plurality of vias penetrating the at least one metal layers and the plurality of insulation layers and overlapped line with the exposed portion of the bottom surface of the metal layer.

An insulation layer disposed to contact with the bottom surface of the metal ground layer may expose a periphery of the metal ground layer.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. The scope of protection sought by the present disclosure is defined by the appended claims and all equivalents thereof are construed to be within the true scope of the present disclosure.

What is claimed is:

1. A display device comprising:
   a display panel;
   a printed circuit board (PCB) underneath the display panel and comprising a plurality of insulation layers and one or more metal layers between two adjacent insulation layers among the plurality of insulation layers; and
   a lower structure between the display panel and the PCB,
   wherein at least a portion of a metal layer among the one or more metal layers that is most adjacent to the lower structure is exposed, and
   the lower structure is electrically connected to the exposed portion of the metal layer,
   wherein the PCB comprises a driving unit or a communications unit and includes a plurality of vias, which overlap with the exposed portion of the metal layer and penetrate the one or more metal layers and the plurality of insulation layers,
   wherein each of the vias is formed along a side surface of a through-hole in the PCB and is in contact with all of the metal layers, and
   wherein the metal layer discharges residual voltage and residual current from a periphery to the lower structure to reduce noise that the residual voltage and the residual current affecting the driving unit or the communications unit.

2. The display device of claim 1, wherein the exposed portion of the metal layer is at a periphery of an outer surface of the PCB.

3. The display device of claim 1, wherein the PCB further includes a fixing screw to fix the PCB and the lower structure, and a ground hole that allows electrical connection to the lower structure.

4. The display device of claim 1, further comprising:
   a conductive adhesive pad between the exposed portion of the metal layer and the lower structure.

5. The display device of claim 4, wherein the conductive adhesive pad is a metal paste.

6. The display device of claim 1, wherein the lower structure includes a protrusion that contacts with the exposed portion of the metal layer directly.

7. The display device of claim 1, wherein the PCB further includes a driving unit or a communications unit, and the driving unit or the communications unit is disposed between a bottom surface of the lower structure and a top surface of the PCB.

8. The display device of claim 1, wherein a width of cross section of the vias is smaller than a width of the exposed portion of the metal layer.

9. A display device comprising:
   a display panel;
   a printed circuit board (PCB) configured to carry signals to the display panel; and
   a lower structure configured to support the display panel and the PCB,
   wherein the PCB includes a metal layer configured to allow discharge of electromagnetic fields at a periphery of the PCB to the lower structure,
   wherein the PCB comprises a driving unit or a communications unit, and
   wherein the metal layer discharges residual voltage and residual current from the periphery to the lower structure to reduce noise that the residual voltage and the residual current affecting the driving unit or the communications unit.

10. The display device of claim 9, further comprising:
    a plurality of insulation layers each in contact with either surface of the metal layer,
    wherein an insulation layer among the plurality of insulation layers that is adjacent to the lower structure is configured to allow at least a portion of the metal layer to be electrically connected to the lower structure.

11. A printed circuit board (PCB) comprising:
    a plurality of insulation layers; and
    at least one metal layer between two adjacent insulation layers among the plurality of insulation layers,
    a plurality of vias penetrating the at least one metal layer and the plurality of insulation layers,
    wherein at least a portion of a bottom surface of a metal ground layer that is a lowest layer among the at least one metal layer is exposed,
    wherein the plurality of vias are overlapped with the exposed portion of the bottom surface of the metal layer, and
    wherein each of the vias is made up of a metal layer formed along a side surface of a through-hole in the PCB and is in contact with all of the metal layers.

12. The PCB of claim 11, wherein an insulation layer disposed to contact with the bottom surface of the metal ground layer exposes a periphery of the metal ground layer.

13. The PCB of claim 11, wherein a width of cross section of the vias is smaller than a width of the exposed portion of the metal layer.

* * * * *